United States Patent [19]

Ritland et al.

[11] Patent Number: 5,735,332
[45] Date of Patent: *Apr. 7, 1998

[54] METHOD FOR MAKING A CERAMIC METAL COMPOSITE

[75] Inventors: Marcus A. Ritland, Golden; Dennis W. Readey, Lakewood, both of Colo.

[73] Assignee: Coors Ceramics Company, Golden, Colo.

[*] Notice: The portion of the term of this patent subsequent to May 6, 2014, has been disclaimed.

[21] Appl. No.: 789,075

[22] Filed: Feb. 3, 1997

Related U.S. Application Data

[63] Continuation of Ser. No. 403,786, filed as PCT/US93/08835, Sep. 17, 1993, abandoned, which is a continuation-in-part of Ser. No. 946,972, Sep. 17, 1992, abandoned, and Ser. No. 947,427, Sep. 18, 1992, abandoned.

[51] Int. Cl.[6] ............................................. B22D 19/00
[52] U.S. Cl. ......................... 164/98; 164/97; 164/101
[58] Field of Search ............................. 164/98, 97, 101; 419/1, 2, 5, 22, 35, 45

[56] References Cited

U.S. PATENT DOCUMENTS

| | | | |
|---|---|---|---|
| 3,868,267 | 2/1975 | Gazza et al. | 117/22 |
| 3,928,662 | 12/1975 | Kaneko et al. | 164/98 |
| 3,949,804 | 4/1976 | Kaneko et al. | 164/62 |
| 4,164,424 | 8/1979 | Klug et al. | 106/38.9 |
| 4,828,008 | 5/1989 | White et al. | 164/66.1 |
| 4,849,266 | 7/1989 | Dwivedi et al. | 428/34.4 |
| 4,935,055 | 6/1990 | Aghajanian et al. | 164/66.1 |
| 5,000,247 | 3/1991 | Burke | 164/97 |
| 5,020,584 | 6/1991 | Aghajanian et al. | 164/97 |
| 5,040,588 | 8/1991 | Newkirk et al. | 164/97 |
| 5,125,962 | 6/1992 | Krentscher | 419/57 |
| 5,249,621 | 10/1993 | Aghajanian et al. | 164/97 |
| 5,390,722 | 2/1995 | Ashok et al. | 164/97 |
| 5,395,701 | 3/1995 | White et al. | 428/614 |
| 5,626,914 | 5/1997 | Ritland et al. | 427/377 |

*Primary Examiner*—Joseph J. Hail, III
*Assistant Examiner*—I.-H. Lin
*Attorney, Agent, or Firm*—Sheridan Ross P.C.

[57] ABSTRACT

The present invention is directed to a process for fabricating ceramic-metal composites having continuous ceramic and metal phases. The process includes the steps of contacting a porous ceramic matrix material with a molten metal whereby capillary action pulls the metal into the ceramic matrix to substantially fill the void space. The present invention also provides a ceramic-metal composite having continuous metal and ceramic phases.

22 Claims, 1 Drawing Sheet

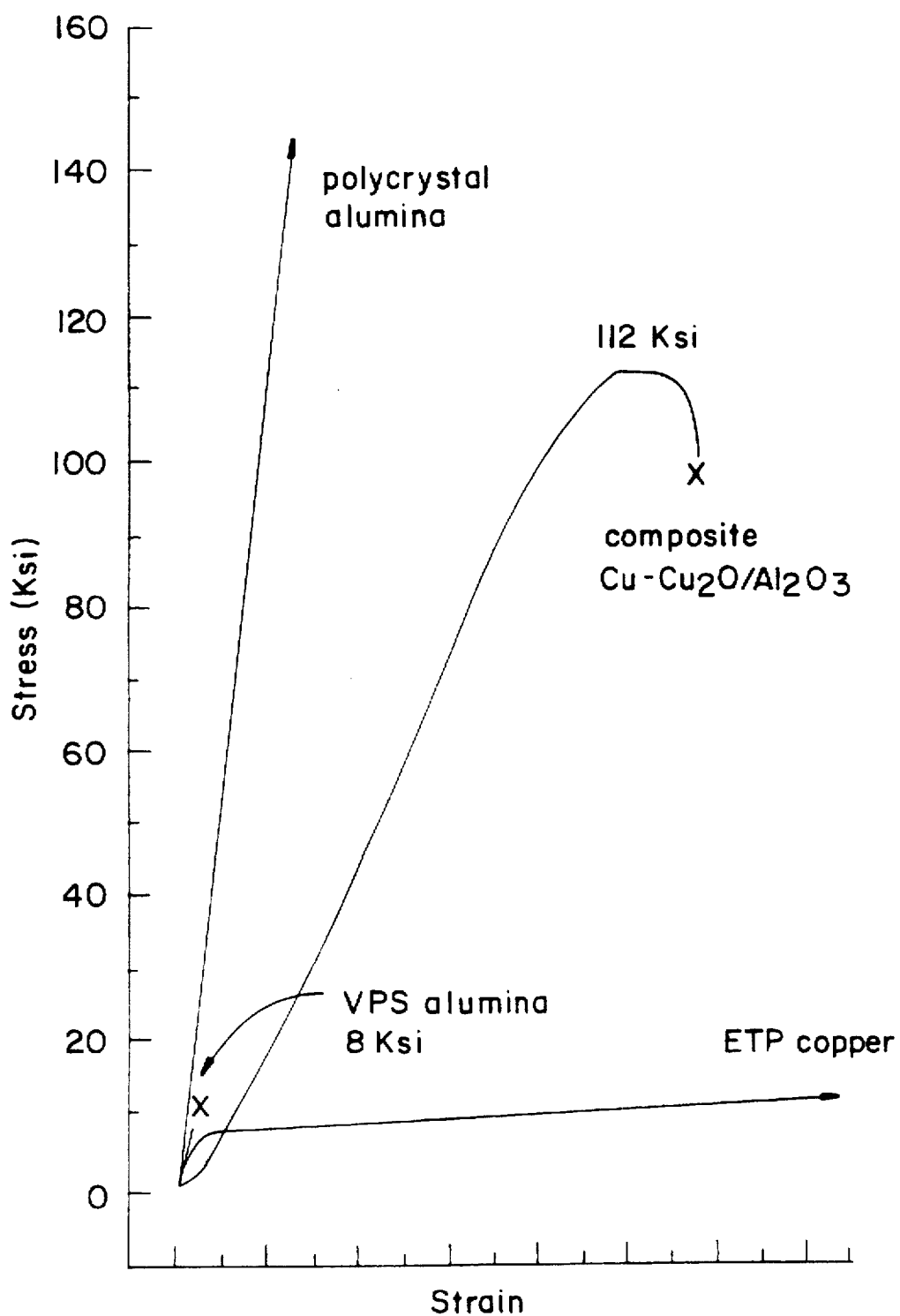

METHOD FOR MAKING A CERAMIC METAL COMPOSITE

This application is a continuation of application Ser. No. 08/403,786, filed on Jun. 9, 1995 (which is a National Phase application PCT US93/08835 filed Sep. 17, 1993), which is a continuation-in-part of U.S. patent application Ser. No. 946,972 filed on Sep. 17, 1992, now abandoned and is a continuation-in-part of U.S. patent application Ser. No. 07/947,427 filed Sep. 18, 1992, now abandoned.

BACKGROUND OF THE INVENTION

1. Field of the Invention

This invention relates to ceramic-metal composite materials, or cermets, and methods of producing the same. More particularly, the invention relates to an efficient method for producing ceramic-metal composites having substantially continuous metal and ceramic phases which permits a wide variety of metals and ceramic matrix materials to be used and a wide variety of products to be formed.

2. Description of Related Art

During the last few decades, ceramics have been investigated for the purpose of introducing them into structural applications, primarily in high temperature environments. However, ceramic materials are not always well suited since they are brittle, have a limited ductility and low values of fracture toughness at low temperatures. In addition, the fracture strength of ceramics is not very reproducible since the average strength usually varies from one lot of parts to the next, which is attributed to the presence of processing flaws which can initiate fractures. Because ceramic materials have great potential for high temperature applications due their creep and oxidation resistance, a great deal of effort has been expended in an attempt to increase the fracture reliability of ceramic materials and to develop tough and creep-resistant composites.

One possible solution is the fabrication of a metal/ceramic composite, commonly known as a cermet. Traditionally, cermets have been obtained in one of two ways: (1) by heating mixtures of ceramic and metal materials to obtain a metal matrix having a discrete ceramic phase, or (2) as disclosed in U.S. Pat. No. 2,612,443 by Goetzel at al., issued Sep. 30, 1952, by forming green body substrates of either fibers, whiskers or particles through pressing, injection molding, casting or other techniques, sintering the green body and infiltrating the porous body with a molten metal through use of squeeze-casting or other means of applying pressure to force the molten metal into the voids within the body.

Sintering green bodies to densify and increase grain size is known in the art. Vapor phase sintering is also a known method for increasing neck growth between grains without densification in particulate green bodies. See, for example, U.S. Pat. No. 4,108,672 by Klug et al., issued Sep. 22, 1978. Until recently however, vapor phase sintering had not been used as a means of controlling the total porosity and average pore size of ceramics. See Readey et al., "Effects of Vapor Transport on Microstructure Development", *Ceramic Microstructures*, pgs. 485–496 (1987) and Readey, "Vapor Transport and Sintering", in *Ceramic Transactions*, Vol.7, pgs. 86–110 (1989).

Infiltration of molten metals into porous ceramic preforms by squeeze casting and by applying pressure to the molten metal are known, for example, see Verma and Dorcic, "Performance Characteristics of Metal-Ceramic Composites Made by the Squeeze Casting Process", *Ceramic Engineering Science Proc.*, Vol. 9, pgs. 579–596 (1988). The major disadvantage of these methods, however, is that it is difficult to achieve near complete infiltration of the void space within the preforms without use of substantial pressures. In addition, when ceramic preform materials contain a high volume porosity, use of pressure in squeeze casting techniques can crumble the delicate ceramic structure.

Infiltration using vacuum furnaces and using infiltration enhancers are also known. U.S. Pat. No. 3,864,154 by Gazza et al., issued Feb. 4, 1975 discloses a method for infiltration of porous ceramics under reduced pressure in a vacuum furnace. U.S. Pat. No. 5,004,035 by Burke et al., issued Apr. 2, 1991, discusses use of infiltration enhancers for infiltrating aluminum alloys into alumina or silicon carbide preforms. However, none of these references discuss processes to control porosity and pore size of the preform over a broad range in conjunction with infiltration.

Infiltration through capillary action has also been utilized, as disclosed in U.S. Pat. No. 3,310,427 by Cheney et al., issued Mar. 21, 1967 and Martins, "Modeling of Infiltration Kinetics for Liquid Metal Processing of Composites", *Metallurgical Transactions B* (1988). The Cheney et al. patent discloses the infiltration of refractory metal with a metal having a lower melting point. Previously mentioned U.S. Pat. No. 3,864,154 by Gazza et al. also discloses infiltration of molten metals wherein a cold-pressed compact of powder such as $AlB_{12}$ is placed between two layers of metal and heated in a crucible.

More recently, other approaches for forming cermets have been used due to a lack of success in obtaining adequate control of cermet composition and forming with traditional processes. For example, use of accelerated oxidation reactions and "combustion wave" exothermic reaction processes have been utilized to form cermets. The patented LANXIDE process, as disclosed in U.S. Pat. No. 4,853,352 by Newkirk et al., assigned to Lanxide Technology Company, issued Aug. 1, 1989, is a method for forming cermets whereby a molten parent metal is oxidized, usually in the presence of oxidation enhancing dopants, to create a three-dimensional interconnected ceramic-metal composite material which contains between 1 and 40% of the parent metal by volume.

A number of other patents assigned to Lanxide Technology Company, an example of which is U.S. Pat. No. 4,824,622 by Kennedy et al., issued Apr. 25, 1989, disclose conducting an oxidation reaction within a bed of filler material or other preforms to form macro- and microcomposite materials.

Other patents that have been commonly assigned to Lanxide Technology Company include U.S. Pat. No. 4,828,008 by White et al. and issued on May 9, 1989. White et al. disclose that in order to infiltrate aluminum metal into a permeable mass of loose ceramic powder, such as alumina, a nitrogen gas atmosphere must be used and magnesium must be alloyed into the aluminum metal. U.S. Pat. No. 5,016,703 by Aghajanian et al. and issued on May 21, 1991, discloses a process for the spontaneous infiltration of aluminum into a ceramic preform in the form of particles, platelets, whiskers or fibers. An infiltration enhancer, such as magnesium turnings, are placed between the molten metal and the preform to permit the infiltration.

U.S. Pat. No. 4,868,143 by Newkirk et al. and issued on Sep. 19, 1989, discloses a process for making a composite wherein an oxidation reaction product (e.g. alumina) is formed with aluminum parent-metal interconnected therethrough. The composite is contacted with a molten second metal which then infiltrates the interconnected parent metal by interdiffusion. The result is a composite having a mixture of two metals interconnected throughout the composite.

The difficulties with the LANXIDE processes and similar processes are that only very limited control of porosity is possible. In addition, in order to infiltrate a metal different from the parent metal which was oxidized to form the ceramic material, the remaining parent metal must be removed from the three-dimensional interconnecting pore system of the preform. Furthermore, in order to insure near complete infiltration of the foreign metal, pressure must be applied to the molten metal infiltrant or an infiltration enhancer must be used which can alter the composition of the composite. The LANXIDE technique of growing an oxidation layer from a molten parent metal by application of oxidation enhancing dopants has some utility, however, production of intricate geometric shapes utilizing the LANXIDE process is extremely difficult.

Producing ceramic materials for infiltration through exothermic combustion wave reactions, as disclosed in U.S. Pat. No. 4,988,645 by Holt et al., issued Jan. 29, 1991, has been achieved to a limited extent to obtain porous ceramic bodies for later infiltration with molten metals. However, the applicability of this method of producing cermets is limited to those materials which form through exothermic reactions.

All of these processes have limitations on the control of the metal and ceramic parameters thought to be important for the development of a tough and creep-resistant ceramic-metal composite material. Thus, there is a need for a new method of producing ceramic-metal composites having carefully controlled compositions. The present invention's unique application of capillary action to infiltrate a sintered ceramic preform with molten metal addresses this need.

The present invention results in ceramic-metal composite materials which are particularly useful for application as engine components, heat exchangers, kiln furniture, cutting tools, abrasives, valve components, pump components, bearings, seals, dies, diffusion tubes, mufflers, tiles, and radiation barriers. The composites are particularly useful in applications demanding creep resistance and wear resistance where pure metals or traditional cermets are insufficient.

SUMMARY OF THE INVENTION

The present invention is directed to a process for forming a ceramic-metal composite. The process includes the steps of contacting a porous ceramic body having a continuous 3-dimensional pore structure with a molten metal such that substantially all of the void space in the ceramic is filled with metal.

In one embodiment, the ceramic matrix is formed by an enhanced vapor phase sintering process. This process advantageously permits independent control over the total porosity and pore size of the ceramic material. In one embodiment, the ceramic matrix comprises alumina and the infiltrating metal comprises copper.

The present invention is also directed to a method for making a ceramic-metal composite, comprising the steps of forming an alumina ceramic body having substantially interconnected porosity in the range of from about 10 percent to about 80 percent, heating a metal comprising copper metal to substantially melt the copper metal and contacting the alumina ceramic body with the heated metal in a vacuum to infiltrate the metal into the alumina ceramic. In a preferred application, the alumina ceramic body is a filter element and the copper comprising metal infiltrates a portion of the filter element.

The present invention is also directed to a method for sealing the end of a ceramic filter element, comprising the steps of contacting the filter element with a molten metal to infiltrate the metal into a portion of the filter element and cooling the metal to form a filter element having a composite portion. The method can also include the step of brazing a seal ring to the composite portion.

The present invention is also directed to a method for making a ceramic-metal gradient composite, comprising the steps of forming a ceramic body having at least two portions wherein at least one of the portions has a different porosity than the other portion, heating a metal to substantially melt the metal and contacting a porous portion of the ceramic body with the heated metal to infiltrate the metal into the ceramic. In one embodiment, the ceramic comprises aluminum titanate.

The present invention also includes a process for producing a sintered ceramic body, comprising the steps of forming a green body comprising alumina powder, sintering the green body at a temperature of at least about 1350° C. in the presence of a reaction gas to promote the formation of an aluminum-containing transport gas species, wherein the sintered ceramic body has a total porosity of from about 10 percent to about 80 percent and a substantially continuous and interconnected pore structure.

The composites formed according to the present invention are useful in many applications, particularly those requiring high-temperature creep and toughness.

BRIEF DESCRIPTION OF THE DRAWINGS

FIG. 1 is a stress-strain diagram comparing a composite produced according to the present invention with the component materials of the composite.

DESCRIPTION OF PREFERRED EMBODIMENTS

The present invention is directed to a method for making a ceramic-metal composite material with interconnecting and substantially continuous ceramic and metal phases. The composite is formed by infiltrating molten metal into a porous ceramic body having a substantially interconnected continuous pore structure. In one embodiment of the present invention, the ceramic is formed by sintering a green body of ceramic powder using an enhanced vapor phase sintering process. Vapor phase sintering permits the total porosity and the average pore size of the porous ceramic body to be carefully and independently controlled.

The ceramic matrix material can be chosen from any of a number of metal oxides, carbides, nitrides or the like. For instance, the ceramic matrix can comprise alumina ($Al_2O_3$), titania ($TiO_2$), zinc oxide (ZnO), zirconia ($ZrO_2$), iron oxide ($Fe_2O_3$), magnesia (MgO), silica ($SiO_2$), or any other metal oxide. Further, non-oxide ceramics such as silicon carbide (SiC), silicon nitride ($Si_3N_4$), aluminum nitride (AlN) or titanium diboride ($TiB_2$) can be used as the ceramic matrix material. Preferred matrix materials include alumina, aluminum titanate ($Al_2TiO_5$), silicon carbide and silicon nitride.

The infiltrant metal can be selected from any metal whose melting point is below the melting point of the ceramic matrix material. For example, copper (Cu), nickel (Ni), aluminum (Al) or alloys thereof can be used for the metallic penetrating phase. Preferred metals include copper, iron (Fe), stainless steel, nickel, titanium (Ti), aluminum, magnesium (Mg), brass (Cu—Zn), bronze (Cu—Sn), and nickel aluminide (NiAl). Further, high strength super alloys and other high-grade metals can advantageously be selected depending on the intended application of the ceramic-metal composite material.

The ceramic matrix material is a sintered, coherent body and should have an open and substantially continuous pore structure to facilitate the infiltration of molten metal into the matrix without the use of substantial overpressure. Porous ceramics can be formed in a number of ways known to those skilled in the art of ceramic processing.

In one embodiment of the present invention, a green body comprising a ceramic powder is formed and is sintered in an enhanced vapor phase sintering process to form a porous body that is particularly useful as the ceramic matrix material. The porous ceramic body has a substantially continuous and interconnected pore structure. The total porosity and average pore size of the sintered ceramic matrix can be controlled by controlling the porosity of the green body and the sintering conditions. Vapor phase sintering is a convenient process to produce porous ceramics having controlled porosities and pore sizes. As such, the porous ceramics form suitable matrices for infiltration with molten metals to produce ceramic-metal composites having interpenetrating three-dimensional structures.

In this embodiment, a green body is preferably formed comprising ceramic powder. In one embodiment of the process, the powder has an average particle size of from about 0.1 microns to about 2 microns. It is not believed that the starting particle size is particularly critical to the practice of the present invention, however, a smaller average particle size can be used to produce a sintered body having a lower average pore size.

The average particle size of the powder can advantageously be reduced to a desired size by comminution processes such as by using a ball mill or an attrition mill. A ball mill is a hollow rotating cylinder or conical cylinder partially filled with hard, wear-resistant media that impacts the powder to reduce the particle size of the powder. An attrition mill is a stirred-media mill wherein a central shaft with arms rotates to mix the particles with hard spherical media. The degree of reduction in particle size can be controlled by controlling the amount of time in the mill. Liquids can also be added to the mill charge to assist in the comminution process and control agglomeration of the particles.

According to one embodiment of the present invention, it may be desirable to form agglomerates of the powder as a means of controlling the porosity of a green body formed from the powder. For example, aluminum hydroxide (Al(OH)$_3$) particles having a diameter of, for example, about 50 micrometers can be calcined to form alumina agglomerates that have a porosity of about 50 percent. As used herein, all percentages refer to volume percent, unless otherwise noted.

After a ceramic powder having a desired particle size range has been obtained, the powder can be formed into a green body. As used herein, the term green body refers to an unsintered cohesive body comprising ceramic powder. For example, the powder can be uniaxially pressed at a pressure of from about 48 MPa to about 69 MPa (7 ksi to 10 ksi) or isostatically pressed at similar pressures. In addition, forming additives can be used to improve the mechanical strength of the green body formed by pressing the ceramic powder. Additives can include binders such as polyvinyl alcohol, plasticizers such as polyethylene glycol, and lubricants such as aluminum stearate. In addition, other forming methods such as injection molding, extrusion, slip casting and the like can be used to form green bodies according to the present invention.

Further, some green bodies with high levels of forming additives may have sufficient strength to enable the green body to be machined. Thus, intricate parts may advantageously be formed by machining processes while the piece is in the soft green state.

According to the present invention, one method for controlling the total porosity of the sintered ceramic matrix is to control the total porosity of the green body. This can be done, for example, by varying the pressing pressure. Typically, green bodies formed by uniaxially pressing finely-divided ceramic powder have porosities ranging from about 50 percent to about 65 percent. The total porosity can be increased by using agglomerated powder, as discussed hereinabove. In this embodiment, the agglomerates having a porosity of about 50 percent are pressed into an arrangement yielding a void space between agglomerates of 50 percent to 65 percent. Thus, the compact may have a total porosity of from about 70 percent to about 80 percent.

After forming the green body, the green body can be sintered to obtain a sintered ceramic body. If organic binders or other organic materials are used in the green body forming process, these additives can advantageously be removed prior to fully sintering the ceramic powder. This is commonly referred to as "binder burnout." For example, the green body can be placed in a furnace and slowly heated to a temperature of, for example, about 600° C. to volatilize organic additives. Since these organic additives comprise a large amount of carbon, it is preferable to volatilize these materials under a flowing gas such as oxygen.

In one embodiment of the present invention, the green body is presintered. Presintering is a convenient and economical method of controlling the total porosity of the final sintered body. Presintering conveniently lowers the porosity of the green body to a range that is desirable for the sintered body, since the vapor phase sintering technique does not substantially affect the total porosity of the sintered body.

Preferably, the presintering step is done at a temperature that is slightly below the normal solid-state sintering temperature of the ceramic material. For example, alumina can be presintered at a temperature of from about 1300° C. to about 1600° C., more preferably from about 1450° C. to about 1550° C. The sintering atmosphere is not critical and, therefore, air is preferred. However, certain atmospheres may be undesirable due to reactions between the atmosphere and the ceramic material at the sintering temperature. The presintering step preferably produces a presintered body having a total porosity of from about 10 percent to about 50 percent. The total porosity can be controlled by varying the time at the presintering temperature, such as from about 1 minute to about 300 minutes. The presintering step can determine the total porosity of the final sintered body, however, presintering may not be necessary if the green body has the desired total porosity for the final sintered product.

The presintered or green ceramic body is then sintered to form a porous sintered ceramic body. According to one embodiment of the present invention, the ceramic body is sintered in an enhanced vapor phase sintering mode in order to maintain control over the total porosity and average pore size of the sintered body.

Enhanced vapor phase sintering has been studied for some ceramic materials. According to this process, the ceramic is sintered in the presence of a volatile transport gas at a high partial pressure. Preferably, the partial pressure of the transport gas is at least about $10^{-4}$ atm at the sintering temperature and more preferably at least about $10^{-3}$ atm. It has been found that for some ceramic materials, the vapor phase sintering process may be enhanced by the presence of a reaction gas, particularly a gas comprising a halide, in the sintering atmosphere. For example, vapor phase sintering of magnesia can be enhanced by the addition of hydrogen chloride (HCl) gas:

$$MgO_{(s)} + 2HCl_{(g)} \rightleftharpoons MgCl_{2(g)} + H_2O_{(g)} \qquad (1)$$

In one embodiment of the present invention, an alumina-containing body is sintered in the presence of hydrogen chloride gas (HCl), thereby promoting the reaction:

$$Al_2O_{3(s)} + 6HCl_{(g)} \rightleftharpoons 2AlCl_{3(g)} + 3H_2O_{(g)} \qquad (2)$$

Alternatively, alumina may be sintered in the presence of hydrogen fluoride gas (HF) in which case the vapor phase transport occurs primarily via the process:

$$Al_2O_{3(s)} + 6HF_{(g)} \rightleftharpoons 2AlF_{3(g)} + 3H_2O_{(g)} \qquad (3)$$

The reaction gas (e.g., HCl or HF) can be added to the sintering furnace directly in the form of commercially available bottled gas. In this embodiment, the gas should be dry and contain minimal residual moisture. Residual water ($H_2O$) can drive the reaction back to, for example, alumina formation and inhibit formation of the vapor transport species. Preferably, the partial pressure of the reaction gas is at least about 0.25 atm and is more preferably from about 0.4 atm to about 1 atm.

Alternatively, the gas may be formed in-situ within the sintering furnace. For example, aluminum fluoride ($AlF_3$) powder can be placed in a closed furnace. As the furnace is heated, hydrogen gas is added to the furnace to promote an in-situ reaction to form hydrogen fluoride gas over the alumina. This procedure is particularly advantageous when dangerous gasses such as hydrogen fluoride are used.

Sintering temperatures can vary depending on the ceramic material being sintered. For example, alumina powder is preferably sintered at a temperature from about 1400° C. to about 1600° C. to form a sintered ceramic body. Iron oxide may be sintered at 1300° C. or less. The pore size and pore size distribution can be controlled by adjusting the amount of time that the body is sintered at the sintering temperatures. Table 1 lists the mean pore diameter for alumina compacts sintered at 1600° C. for varying amounts of time under 1 atm HCl. For each sample, the porosity of the sample remained at about 50 percent regardless of the sintering time.

TABLE 1

| TIME | MEAN PORE SIZE |
|---|---|
| 10 min. | 2.1 microns |
| 80 min. | 3 microns |
| 250 min. | 4 microns |
| 1080 min. | 7.5 microns |

As Table 1 illustrates, as the sintering time increases, the average pore diameter also increases. However, the total porosity remains unchanged.

The ceramic body may be sintered in any system in which the partial pressure of the reaction gas, and hence the transporting gas can be controlled. For example, a simple tube furnace having a sealed end with an inlet for the reaction gas may be provided.

It has also been observed that the sintered bodies formed according to the present invention may have a thin (e.g., about 1 grain thick), uniform skin of dense ceramic on their surface. The formation of this skin can be advantageous when the sintered bodies are used in filter applications or if molten metal is infiltrated into the pores to form a composite. The composite would thus have a thin layer of ceramic on the surface and a base comprising a thermally or electrically conductive metal. Such a composite would be particularly useful as a substrate for electronic applications. The density of the skin appears best at higher sintering temperatures, such as at about 1600° C.

When a porous ceramic matrix having the desired total porosity and pore size is obtained, molten metal can be infiltrated into the void space of the ceramic matrix. In a preferred embodiment of the present invention, the ceramic is brought into contact with the molten metal and infiltrates the ceramic by capillary action without the assistance of substantial pressure. Thus, the molten metal enters the pore structure of the ceramic and fills substantially all of the void space. Preferably, the use of infiltration aids that can alter the composition and affect the properties of the composite are not used.

In order to fill substantially all of the void space in the ceramic matrix, it is necessary that the ceramic matrix material have a three dimensional, interconnecting pore structure. Capillary action will pull the metal into the ceramic and thereby fill substantially all of the void space. Although the ideal pore size will vary depending on the ceramic matrix material and metal being infiltrated, it is generally desirable that the average pore size be from about 1 micrometers to about 10 micrometers.

To improve capillary action between the ceramic and the molten metal, it may be desirable to modify the wetting or spreading characteristics of the ceramic and metal. One way to do this is to coat the ceramic with a coating that is more easily wetted by the molten metal. For instance, the surfaces of a magnesia or alumina ceramic can be modified by vapor phase coating the ceramic with nickel oxide. Similarly, the surface of an alumina ceramic can be modified by vapor phase coating the ceramic with copper oxide. The result of the above surface modifications is that the interfacial free energy of the ceramic is reduced and the metal can penetrate the pores more easily.

Another way of enhancing the wetting characteristics is to alter the chemical composition of the molten metal. This is typically accomplished by doping the molten metal with a dopant. For instance, molten copper can be doped with from about 2 weight percent to about 5 weight percent oxygen to form copper oxide ($Cu_2O$) or copper can be doped with from about 4 atomic percent to about 8 atomic percent titanium (Ti). Doping reduces the interfacial free energy between the metal and the ceramic.

After one or more of the surface modifications and chemical alterations noted above, if necessary, the molten metal will wet the ceramic and infiltrate substantially all of the void space of the ceramic through capillary action.

In a preferred embodiment, the metal infiltration step is performed in a vacuum atmosphere. As used herein, vacuum atmosphere refers to an atmospheric pressure of about 10 millitorr or less. The evacuation of air from the ceramic void space reduces the likelihood that air pockets will form in the metal infrastructure.

The temperature at which infiltration takes place is dependent on the ceramic and molten metal used. In one embodiment, an alumina ceramic with a copper oxide coating and a 3 micrometer average pore size is infiltrated with copper doped with about 3 weight percent oxygen at about 1275° C. The total time required for infiltration is very short and can occur in less than about 1 minute in most cases.

The ceramic-metal composites produced by the present invention have relatively high strengths and toughness. In one embodiment, a composite comprising about 65 percent alumina and about 35 percent copper/copper oxide. The composite has a strength of at least about 110 ksi.

According to one preferred embodiment of the present invention, the sintered ceramic matrix material has a porosity gradient. That is, the porous ceramic matrix has regions of different porosity. For example, one portion of the ceramic matrix can be substantially 100 percent dense while another portion can have a high porosity, for example about 60 percent or greater. When the porous end is contacted with molten metal, the metal will infiltrate throughout the ceramic porosity, resulting in an article having a dense ceramic portion and a composite portion. The porosity gradient may be a gradual through the material or it may include one or more abrupt changes in porosity, such as a ceramic matrix formed by layers of material having different porosity characteristics. The advantages of a gradient composite material can include the alleviation of the effects of an abrupt thermal expansion gradient, the ability to attach the composite to a variety of materials and the ability to have an article with a dense ceramic surface intimately attached to a composite surface.

The ceramic-metal composites produced according to the present invention are particularly useful as materials for high temperature applications where creep resistance and high toughness are needed. For example, in automotive components such as valves, exhaust port liners, and seal faces, turbine blades, electrical contacts, armor, boiler tubes, and the like.

One particular application where the process of the present invention has found particular utility is in the field of filters. Ceramic filters comprise long cylindrical bodies of porous ceramic, such as alumina. The cylinders have a plurality of channels parallel to the cylindrical axis for receiving the material (i.e. a liquid) to be filtered. Since the opposite end of the cylinder is sealed or recirculates the liquid to the front end, the liquid is forced through the porous ceramic and is thereby filtered. An example of such a filter is illustrated in U.S. Pat. No. 4,069,157 by Hoover et al., which is incorporated herein by reference in its entirety.

One of the problems associated with manufacturing these filters is sealing the ends of the filter. Typically, the end of the filter must form a seal with a metal component, such as a stainless steel ring. According to one embodiment of the present invention, the end of the filter is infiltrated with metal to assist in sealing the filter. For example, the metal can be selected from copper or a reactive braze such as a copper/silver/titanium alloy. When copper is used to infiltrate into an alumina filter, the resulting composite can be nickel coated to promote adhesion to a stainless steel ring using, for example, a Cu/Ag braze. When using a reactive braze, no brazing material is necessary and the stainless steel ring can be adhered to the filter by heating the components while in contact.

Another application of the present invention is in the area of engine component liners, such as exhaust port liners for diesel engines. See, for example, the port liners described in U.S. Pat. No. 5,066,626 by Fukao et al., which is incorporated herein by reference in its entirety. Aluminum titanate is a preferred ceramic material due to its resistance to corrosion and its low thermal expansion characteristics. One of the problems associated with these port liners is that a compliant layer between the metal (e.g. aluminum or cast iron) and the aluminum titanate is necessary to absorb stresses resulting from the contracting metal.

It is believed that the problem can be reduced by infiltrating an aluminum titanate material having a gradient porosity. The metal composite gradient will assist in alleviating the stresses caused by the contraction of the metal. For example, aluminum could be infiltrated into the aluminum titanate porous body.

EXAMPLES

An alumina powder (CERALOX HPA, Ceralox Corp., Tucson, Ariz.) is obtained having an average particle size of about 1.0 microns. The alumina powder is formed into a green body by uniaxially pressing the powder at a pressure of about 50 MPa to obtain a green body having a porosity of about 55 percent.

The green body is then presintered in air at a temperature of about 1500° C. for about 3 minutes. The presintered body has a porosity of about 35 percent.

The presintered body is then placed in a sintering furnace that comprises an alumina tube. The temperature of the furnace is raised as the furnace is evacuated. Before reaching about 800° C., the furnace is purged with argon gas to remove impurities in the furnace atmosphere. At about 800° C., the furnace is filled with HCl gas having a pressure of about 1 atm. The alumina body is then sintered under HCl gas at a temperature of about 1600° C. for about 80 minutes.

The sintered alumina ceramic has a total porosity of about 35 percent and has an average pore size of about 3 micrometers. The alumina forms a continuous three-dimensional structure and there is substantially no closed porosity.

Thereafter, the alumina ceramic is contacted with a molten copper bath at a temperature of about 1275° C. The bottom surface of the alumina ceramic is contacted with the molten metal and the molten metal infiltrates through the alumina matrix via capillary action. The composite is then cooled. The composite comprises about 65 percent of a substantially continuous alumina phase and about 35 percent copper/copper oxide.

The stress strain diagram for the sample is illustrated in FIG. 1. The composite has a strength of about 112 ksi.

To demonstrate the feasibility of infiltrating aluminum titanate, three disks of a porous aluminum titanate material were obtained. Three metal beads of 1) copper, 2) iron and 3) stainless steel were placed on an aluminum titanate disk and heated to just above the melting point of the metal. Each of the metals infiltrated the aluminum titanate and formed a ceramic-metal composite with the aluminum titanate.

While various embodiments of the present invention have been described in detail, it is apparent that modifications and adaptations of those embodiments will occur to those skilled in the art. However, it is to be expressly understood that such modifications and adaptations are within the spirit and scope of the present invention.

What is claimed is:

1. A method for making a ceramic-metal composite, comprising the steps of:

(a) forming a green body comprising a ceramic powder;

(b) sintering said green body until a sintered ceramic having a predetermined average pore size is obtained; and (c) infiltrating said ceramic with a molten metal, wherein said molten metal comprises oxygen, such that capillary action of the sintered ceramic pulls said molten metal into said sintered ceramic such that substantially all of the volume percent porosity is filled with the molten metal.

2. A method as recited in claim 1, wherein said ceramic powder comprises a metal oxide powder.

3. A method as recited in claim 1, wherein said ceramic powder comprises a metal oxide powder selected from the group consisting of alumina, magnesia, titania, nickel oxide and iron oxide.

4. A method as recited in claim 1, wherein said ceramic powder comprises material selected from the group consisting of silicon carbide, silicon nitride, titanium diboride and aluminum nitride.

5. A method as recited in claim 1, wherein said molten metal comprises copper.

6. A method as recited in claim 1, wherein said sintering step comprises the step of sintering at a temperature in the range of from about 1300° C. to about 1600° C. in an atmosphere comprising hydrogen chloride.

7. A method as recited in claim 1, further comprising the step of vapor phase coating said ceramic to alter the ceramic interfacial free energy.

8. A method as recited in claim 1, further comprising the step of doping said molten metal with a dopant to alter the interfacial free energy characteristics of the molten metal.

9. A method as recited in claim 1, wherein said infiltrating step comprises the step of infiltrating said molten metal into said ceramic in a vacuum.

10. A method as recited in claim 1, wherein said infiltrating step comprises the step of contacting at least a portion of said ceramic with at least a portion of said molten metal.

11. A method as recited in claim 1, wherein said porosity is in the range of from about 10 percent to about 80 percent and said average pore size is in the range of from about 1 micrometers to about 10 micrometers.

12. A method as recited in claim 1, wherein said ceramic/metal composite has a strength of at least about 110 ksi.

13. A method of making a ceramic-metal composite material, comprising the steps of:

(a) forming a green body comprising a ceramic powder;

(b) sintering said green body until a ceramic of desired average pore size and porosity is obtained, and wherein said porosity is in the range of from about 10 volume percent to about 80 volume percent and said average pore size is in the range of from about 1 micrometers to about 10 micrometers;

(c) doping a quantity of molten metal with a dopant comprising oxygen to alter the interfacial free energy characteristics of the molten metal; and (d) infiltrating said ceramic with said molten metal by capillary action such that substantially 100 percent of the volume percent porosity is filled with the molten metal.

14. A method as recited in claim 13, wherein said metal oxide powder is alumina powder.

15. A method as recited in claim 13, wherein said molten metal is molten copper.

16. A method as recited in claim 13, wherein said dopant is a copper oxide.

17. A method as recited in claim 13, wherein said sintering step is performed at a temperature in the range of from about 1300° C. to about 1600° C. in an atmosphere comprising at least about 0.25 atm hydrogen chloride gas.

18. A method as recited in claim 13, further comprising the step of vapor phase coating said ceramic with an oxide coating to alter the ceramic interfacial free energy.

19. A method as recited in claim 13, wherein said infiltrating step comprises contacting a portion of said ceramic to a portion of said molten metal.

20. A method for making a ceramic-metal composite, comprising the steps of:

(a) forming an alumina ceramic body having substantially interconnected porosity in the range of from about 10 volume percent to about 80 volume percent;

(b) heating a metal comprising copper metal and copper oxide to substantially melt said copper metal; and (c) contacting said alumina ceramic body with said heated metal in a vacuum to infiltrate said metal into said alumina ceramic.

21. A method as recited in claim 20, wherein said alumina ceramic body is a filter element and said copper infiltrates a portion of said filter element.

22. A method as recited in claim 20, wherein said heated metal infiltrates into said alumina ceramic by capillary action.

* * * * *